United States Patent
Yoshida et al.

(10) Patent No.: US 8,599,051 B2
(45) Date of Patent: Dec. 3, 2013

(54) TIME-INTERLEAVED A/D CONVERTER APPARATUS INCLUDING CORRECTION SIGNAL PART OUTPUTTING A DISPERSION COMPENSATION CONTROL SIGNAL

(75) Inventors: Nobuhide Yoshida, Tokyo (JP); Hidemi Noguchi, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 13/583,918

(22) PCT Filed: Mar. 1, 2011

(86) PCT No.: PCT/JP2011/055175
§ 371 (c)(1),
(2), (4) Date: Sep. 10, 2012

(87) PCT Pub. No.: WO2011/118370
PCT Pub. Date: Sep. 29, 2011

(65) Prior Publication Data
US 2013/0027234 A1    Jan. 31, 2013

(30) Foreign Application Priority Data
Mar. 26, 2010 (JP) ................................. 2010-071481

(51) Int. Cl.
*H03M 1/06* (2006.01)
(52) U.S. Cl.
USPC ........... 341/118; 341/122; 341/120; 398/147; 398/141; 398/192; 398/157; 398/159; 702/69; 702/66; 702/67; 702/68; 359/337.5; 359/341.3
(58) Field of Classification Search
USPC .................... 341/118–155; 359/337.5, 341.3; 702/66–69; 398/27, 81, 141, 147, 157, 398/158, 159, 192
See application file for complete search history.

(56) References Cited

U.S. PATENT DOCUMENTS

| 5,715,265 A * | 2/1998 | Epworth .................... 372/38.01 |
| 6,433,712 B1 * | 8/2002 | Ohnhaeuser et al. ......... 341/118 |

(Continued)

FOREIGN PATENT DOCUMENTS

| JP | 5-276036 (A) | 10/1993 |
| JP | 2003-133954 (A) | 5/2003 |
| JP | 2007-150640 (A) | 6/2007 |

OTHER PUBLICATIONS

International Search Report in PCT/JP2011/055175 dated Mar. 29, 2011 (English Translation Thereof).

(Continued)

*Primary Examiner* — Lam T Mai
(74) *Attorney, Agent, or Firm* — McGinn IP Law Group, PLLC (57) ABSTRACT

A time-interleaved A/D converter apparatus has a primary signal A/D converter circuit group that is time-interleaved with a combination of N A/D converter circuits, a correction signal generation part operable to receive the input analog signal and a 1/m-sampling signal having a speed that is 1/m of a rate of the sampling signal inputted to the primary signal A/D converter circuit group, to extract a dispersion of a transmission line that is immanent in the input analog signal, and to output the dispersion as a dispersion compensation control signal used for digital signal compensation, and a signal processing part operable to convert the N digital signals into one digital signal based upon the dispersion compensation control signal and to compensate a dispersion included in the converted digital signal.

17 Claims, 9 Drawing Sheets

(56) References Cited

U.S. PATENT DOCUMENTS

| | | | |
|---|---|---|---|
| 6,694,273 B2 * | 2/2004 | Kurooka et al. | 702/69 |
| 6,871,024 B2 * | 3/2005 | Nishimoto et al. | 398/159 |
| 7,176,822 B2 * | 2/2007 | Schimper | 341/143 |
| 7,274,879 B1 * | 9/2007 | Sandler et al. | 398/147 |
| 7,336,729 B2 * | 2/2008 | Agazzi | 375/316 |
| 7,389,049 B2 * | 6/2008 | Takahara et al. | 398/81 |
| 7,629,906 B2 * | 12/2009 | Juang et al. | 341/118 |
| 7,751,720 B2 * | 7/2010 | Brandon et al. | 398/157 |
| 7,813,647 B2 * | 10/2010 | Ohtani | 398/147 |
| 8,446,304 B2 * | 5/2013 | Scanlan | 341/120 |
| 2007/0120724 A1 | 5/2007 | Hori et al. | |
| 2008/0049847 A1 | 2/2008 | Telang et al. | |
| 2012/0242520 A1 * | 9/2012 | Noguchi et al. | 341/118 |

OTHER PUBLICATIONS

Wenbo, et al., "A 600MS/s 30mW 0.13Â [mu]m CMOS ADC array achieving over 60dB SFDR with adaptive digital equalization", Solid-State Circuits Conference—Digest of Technical Papers, 2009. ISSCC 2009. IEEE International, IEEE, Piscataway, NJ, USA, Feb. 8, 2009, pp. 82-83, 83a, XP031742175.

* cited by examiner

TIME-INTERLEAVED A/D CONVERTER APPARATUS INCLUDING CORRECTION SIGNAL PART OUTPUTTING A DISPERSION COMPENSATION CONTROL SIGNAL

TECHNICAL FIELD

The present invention relates to an A/D converter apparatus for converting a received signal into a digital signal by analog-digital conversion at certain sampling timing in an optical communication apparatus that receives an optical signal or the like. More specifically, the present invention relates to a time-interleaved A/D converter apparatus that combines a plurality of A/D converter circuits to perform an ultrahigh-speed operation.

BACKGROUND ART

In recent years, speed-enhancement of electronic circuits has been required according to increase in speed and capacity of networks. Circuits used for data conversion, such as an A/D converter circuit and a track/hold circuit (sample/hold circuit), have also been required to operate at higher speeds.

Some circuits and/or configurations have recently been proposed to meet such demands. For example, as one of techniques to achieve high-speed sampling of an A/D converter apparatus, there has been proposed a time-interleaving method of operating a plurality of A/D converter circuits operable at a low sampling rate in a predetermined order and operating the A/D converter circuits in cooperation with each other so that the entire apparatus equivalently achieves high-speed sampling.

Figure 6:
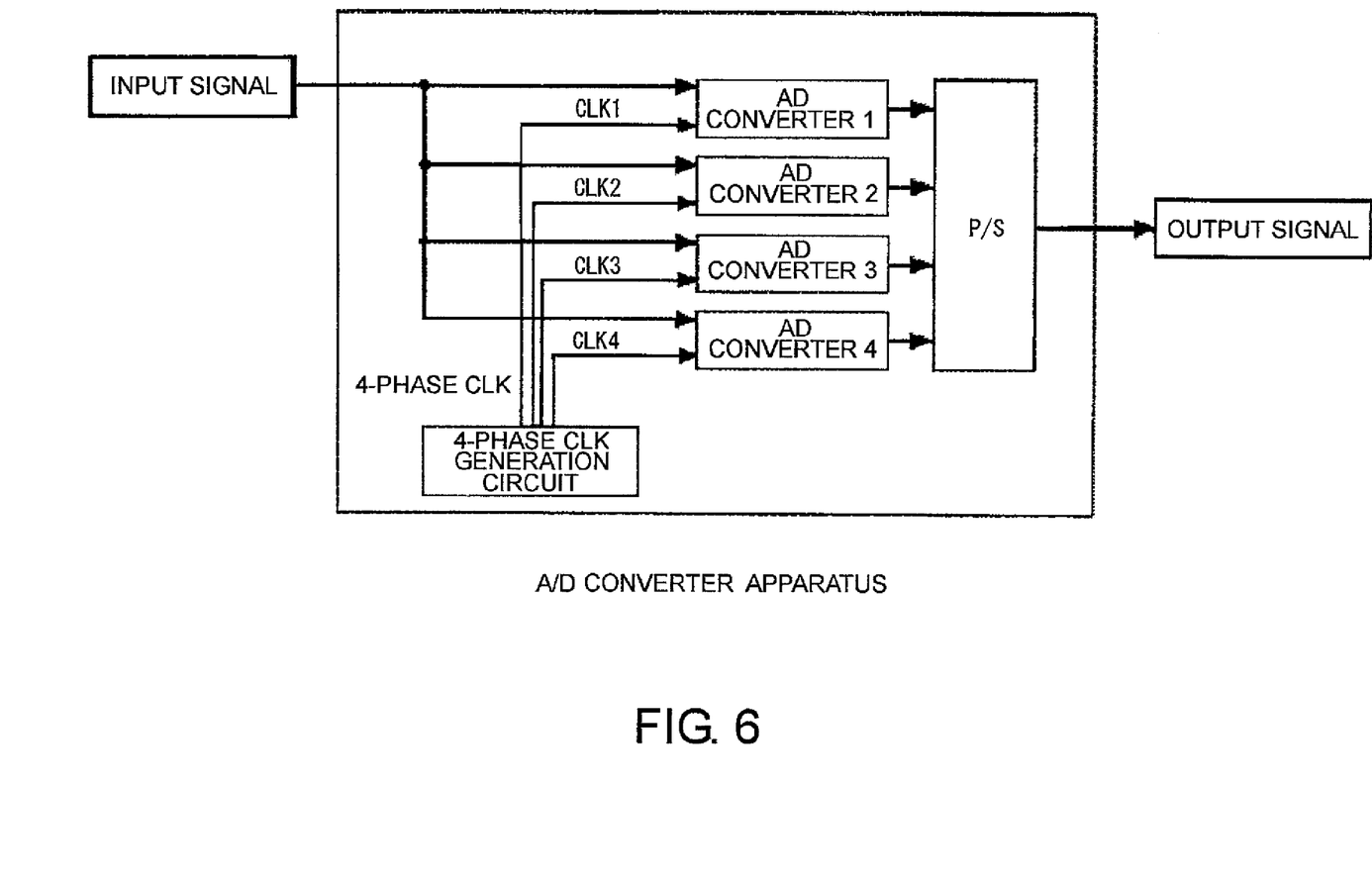
FIG. 6 is a block diagram showing an example of a time-interleaved A/D converter apparatus including an A/D converter circuit group.
Figure 7:
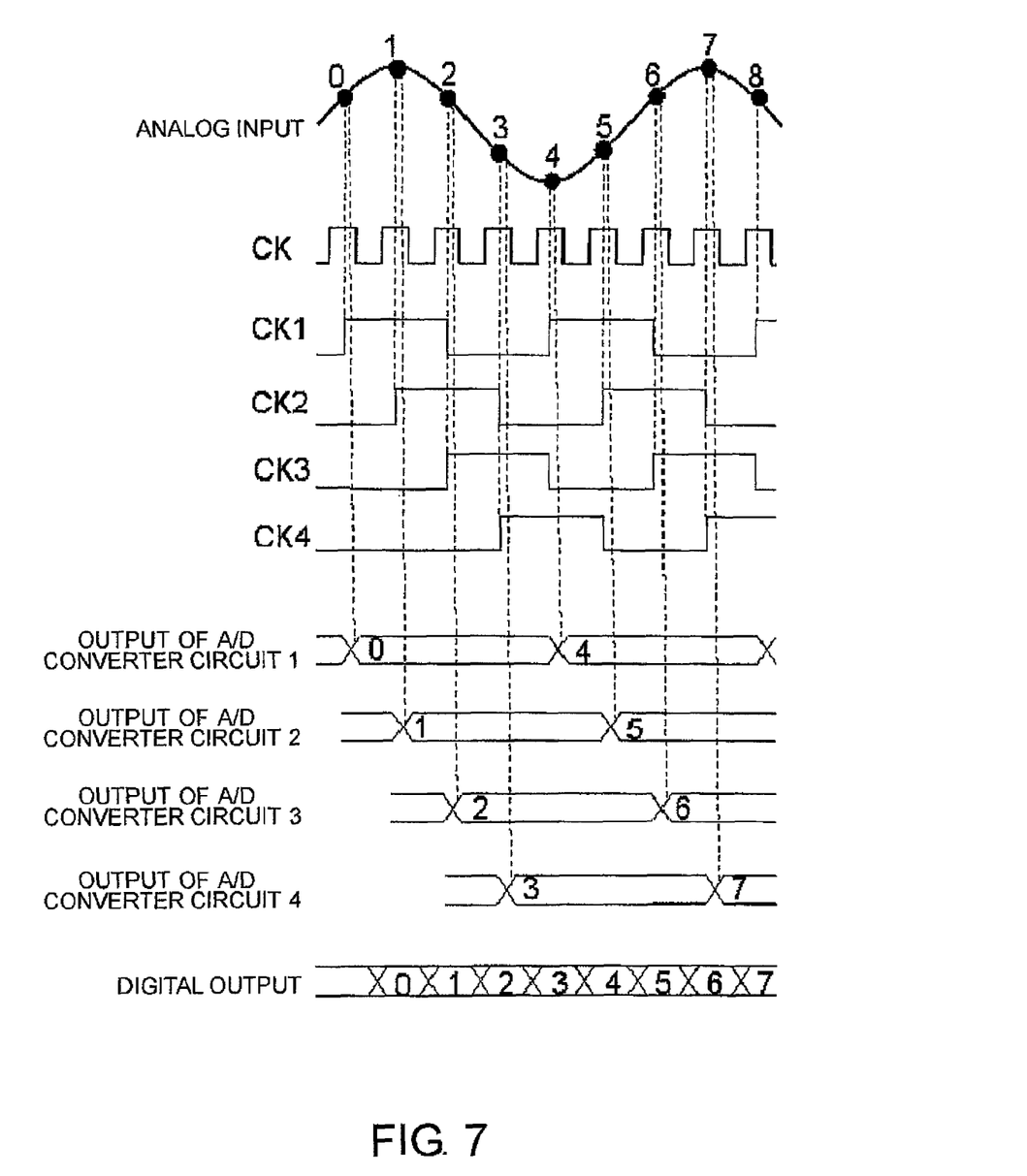
FIG. 7 is a timing chart showing an operation of the time-interleaved A/D converter apparatus shown in FIG. 6.

FIG. 6 shows an example of an A/D converter apparatus using a time-interleaving method. In this method, a plurality of A/D converter circuits or track/hold circuits are formed in parallel as a plurality of channels (AD converters 1 to 4 in FIG. 6) so as to equivalently provide an A/D converter apparatus having a sampling rate that is the same number of times as the number of the channels (four times in FIG. 6). FIG. 7 shows a timing chart of the A/D converter apparatus. With this method, there can be provided an A/D converter apparatus that can perform a high-speed sampling operation without any limitations on high-speed performance of devices used as parts of the A/D converter apparatus.

Along with recent trends of miniaturization and performance enhancement in semiconductor processes, A/D converter apparatuses that can perform such a high-speed sampling operation have further been enhanced in performance. Additionally, a high-speed signal processing system, which has been implemented only by analog circuits, can be achieved by converting an analog signal into a digital signal with an A/D converter apparatus and then conducting digital signal processing. Thus, there has been developed a signal processing system having performance higher than ever. For example, in a field of ultrahigh-speed optical communication in which a data rate of 40 Gb/s or higher has been required for a high speed and a large capacity, introduction of a digital coherent system that can improve performance and achieve longer distance transmission by using digital signal processing with an A/D converter apparatus has actively been promoted.

A feature of an A/D converter apparatus used in a digital coherent communication system of an optical communication field is that an A/D converter apparatus is required to have a slew rate that is higher than a data transmission speed. This is because data should have redundancy due to an error correction technique or the like even if a multi-valued and high-density modulation method, such as phase shift keying, is used. For example, a slew rate around 30 Gb/s is required even in a case where a data transmission speed is 40 Gb/s (20 Gbps in parallel for 40 G). Furthermore, 2× oversampling performance, which is twice the number of channels, is generally is used as a sampling rate of an A/D converter circuit.

Upon application to an optical communication system, an A/D converter apparatus is required to have such sampling performance for the following reasons: In ultrahigh-speed optical communication, a waveform distortion resulting from a dispersion phenomenon in an optical fiber (e.g., a chromatic dispersion or a polarization mode dispersion) becomes a cause of considerable limitations to a transmission distance. In order to compensate a waveform distortion with a high degree of precision by signal processing, 2× oversampling performance is roughly required in general.

As described above, application of a digital signal processing method along with speed-enhancement of an A/D converter apparatus has been active in an ultrahigh-speed communication field such as optical communication. A time-interleaving method using a plurality of parallel A/D converter circuits has attracted much attention as one of techniques for achieving a high-speed A/D converter apparatus. Meanwhile, there is a problem that error components (variations) such as gains or offsets between a plurality of A/D converter circuits increase noise or distortion and thus deteriorate the conversion accuracy of the entire A/D converter apparatus.

Figure 8:
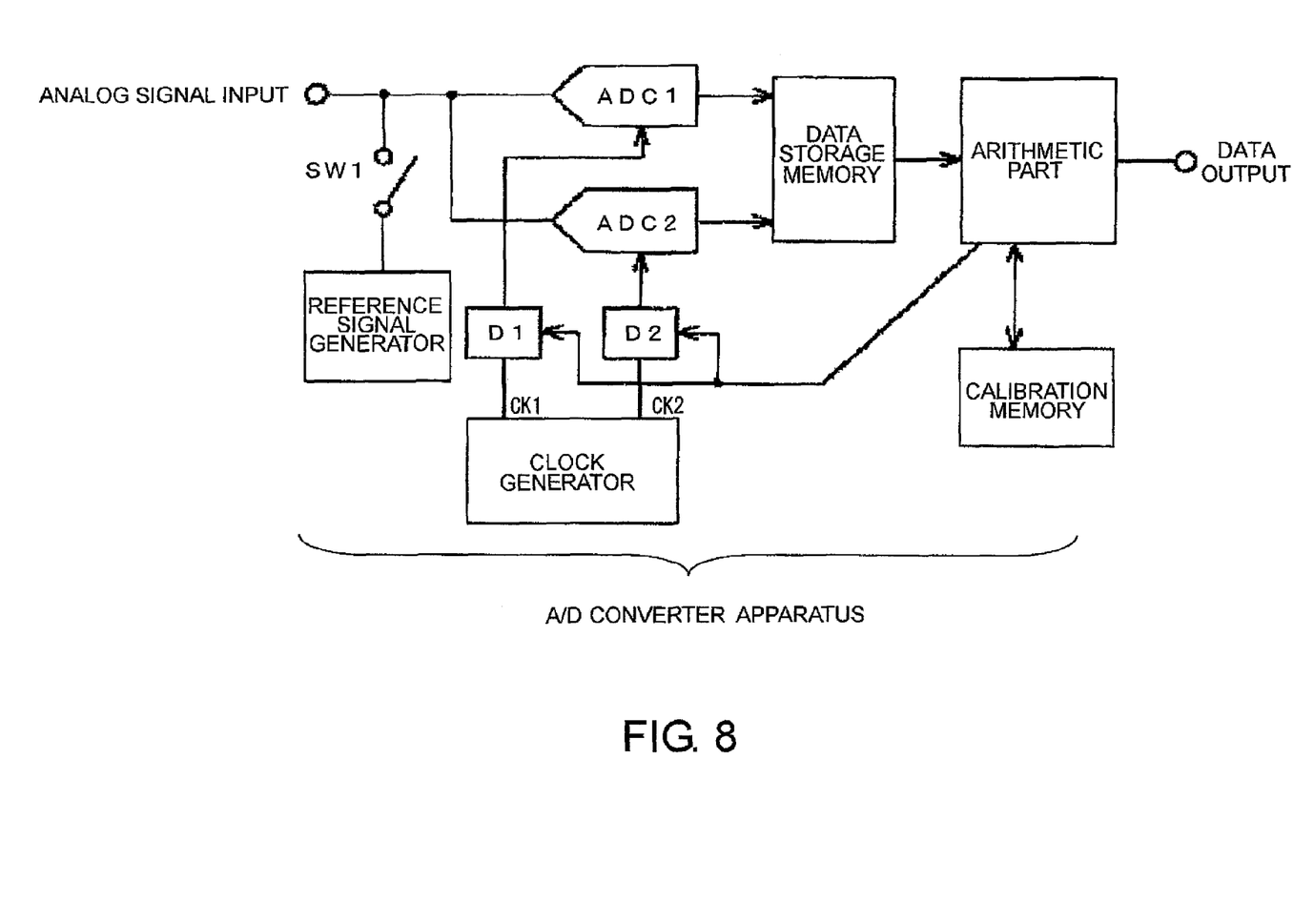
FIG. 8 is a block diagram showing an example of a time-interleaved A/D converter apparatus that compensates individual A/D converter circuits.

A configuration illustrated in FIG. 8 has been proposed as means for calibrating gain and offset error components between a plurality of A/D converter circuits (Patent Literature 1). The calibration method of this invention includes providing means for generating a sine wave signal as a training signal for calibration (reference signal generator), performing a sine curve fitting process on a series of conversion data with the sine wave signal for each of the A/D conversion means (ADC1, ADC2) to calculate calibration values of gains and offsets, and storing the calibration values in a calibration memory. Upon normal A/D conversion, data are calibrated in accordance with the calibration values stored in the calibration memory.

However, an interleaving method disclosed in Patent Literature 1 originally assumes that signals have a data rate of about several tens of Mbps to about several hundreds of Mbps. For example, if an ultrahigh-speed optical communication of 40 Gbps is subjected to AD conversion with the interleaving method of Patent Literature 1, a data rate should be 40 times or more as high as 40 Gbps. Therefore, the scale of a circuit such as correction means and a calibration memory for maintaining the signal quality becomes so enormous that electric consumption increases considerably.

Figure 9:
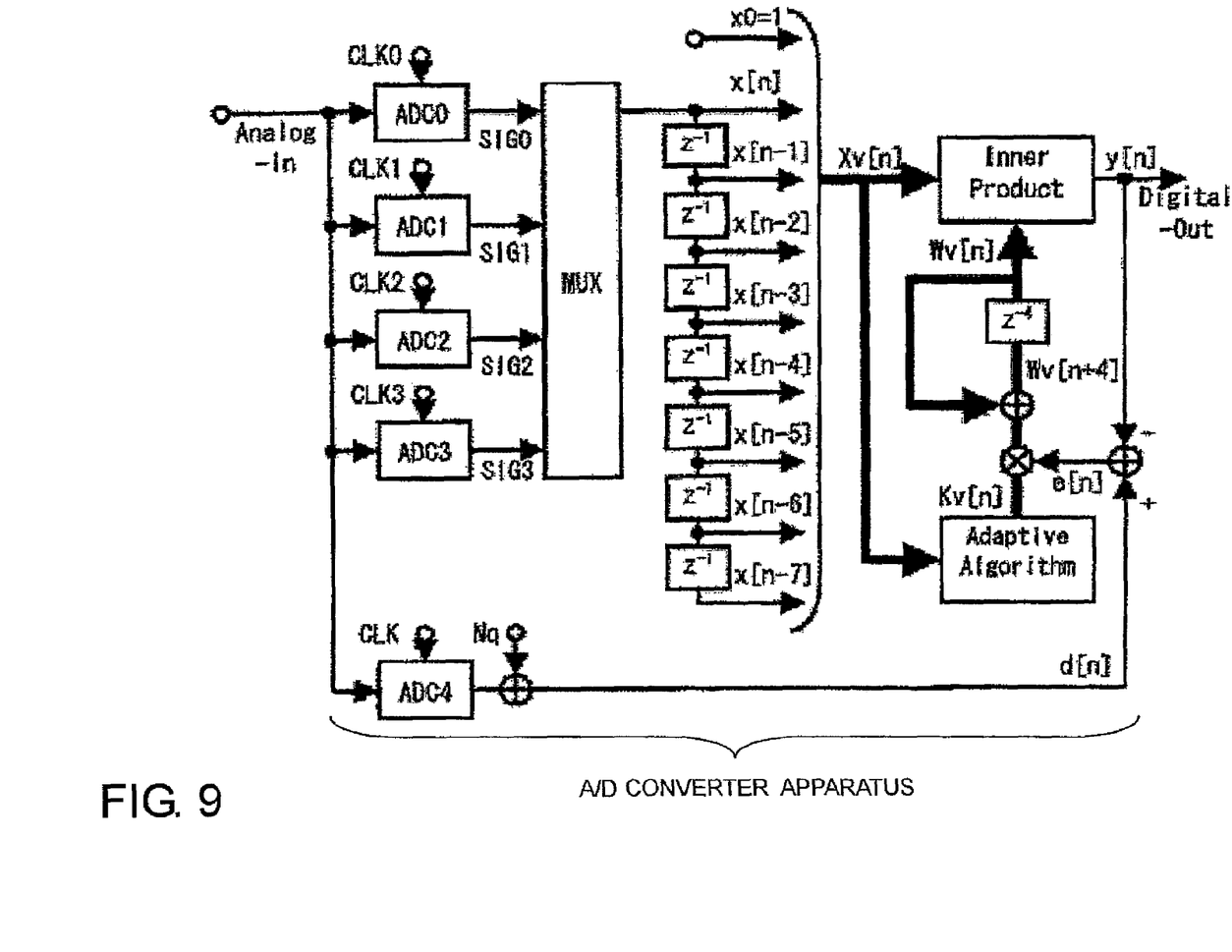
FIG. 9 is a block diagram showing an example of a time-interleaved A/D converter apparatus that synthesizes outputs from individual A/D converter circuits and then compensates output components from the individual A/D converter circuits.

As shown in FIG. 9, for example, there has been proposed a method of correcting an input signal in the entire time-interleaved A/D converter apparatus (Patent Literature 2). The method of correcting an input signal as disclosed in Patent Literature 2 includes integrally calibrating individual output digital signals of parallel A/D converter circuits (ADC0-ADC3) of the time-interleaved A/D converter apparatus. For this purpose, a high-speed low-resolution correction A/D converter circuit (ADC4) operable at the same rate as an equivalent sampling rate obtained upon time-interleaving and a nonlinear filter are added in addition to the parallel A/D converter circuits (ADC0-ADC3). Upon AD conversion in the time-interleaved A/D converter apparatus, output signals (SIG0-SIG3) of the parallel A/D converter circuits are synthesized, then passed through the nonlinear filter, and corrected by a reference signal (instruction signal: d[n]) generated by the correction A/D converter circuit. With such an operation, the digital signals outputted from the individual parallel A/D converter circuits are corrected at the same timing with the reference signal sampled by the correction A/D converter circuit. In other words, the output signals of all of the parallel A/D converter circuits are sequentially calibrated with the output signal of the correction A/D converter circuit.

However, one of primary factors to use an interleaving method is that a time-interleaving method is used because a single A/D converter circuit cannot achieve a desired high speed. In contrast, implementing a high-speed A/D converter circuit (correction A/D converter circuit: ADC4) operable at the same speed (fs×N) as an equivalent sampling rate obtained upon time-interleaving as disclosed in Patent Literature 2 is not preferable for reducing of the circuit scale by using a time-interleaving method. Furthermore, since a high-speed operation is performed, the electric consumption considerably increases in the correction A/D converter circuit.

As described above, when a communication method of high-precision digital signal processing with A/D converter circuits is applied to current high-speed optical communication systems, the circuit scale and electric consumption problematically increase in the following two aspects:

1) In ultrahigh-speed optical communication, a waveform distortion resulting from a chromatic dispersion, a polarization mode dispersion, or the like in an optical fiber becomes a cause of limitations on a transmission distance. In order to compensate such a waveform distortion with a high degree of precision by signal processing, 2× oversampling performance is roughly required in general. Therefore, increase of the circuit scale and electric consumption is caused.

2) In most cases, high-speed sampling performance of an A/D converter apparatus is achieved by an interleaving method. Meanwhile, correction means for ensuring the signal quality is also provided in many cases. When the correction means is taken into account, the circuit scale and electric consumption considerably increase in the entire A/D converter apparatus.

PRIOR ART LITERATURE

Patent Literature 1: JP-A 2003-133954
Patent Literature 2: JP-A 2007-150640

SUMMARY OF THE INVENTION

Problem(s) to be Solved by the Invention

Reduction of the circuit scale is achieved by reduction of a sampling rate of A/D converter circuits. If the processing speeds of interleaved A/D converter circuits are constant, the number of the A/D converter circuits can be reduced by half when the sampling rate is changed from 2× oversampling to a Baud rate. In ultrahigh-speed optical communication that exceeds 40 Gb/s, however, a waveform distortion resulting from dispersion phenomena (a chromatic dispersion and a polarization mode dispersion) in an optical fiber acts significantly. Therefore, reduction of the sampling rate is directly connected with deterioration of the signal quality. In such a case, there is no merit in using a digital signal processing method.

Furthermore, the circuit scale and the sampling rate are directly connected with the electric consumption in the A/D converter apparatus.

The present invention provides a time-interleaved A/D converter apparatus and a method therefore that can reduce a circuit scale and an electric consumption without deterioration of signal quality when a plurality of A/D converter circuits performing a time-interleaving operation are applied to high-speed communication such as ultrahigh-speed optical communication.

Means to Solve the Problem

A time-interleaved A/D converter apparatus according to the present invention is characterized by comprising a primary signal A/D converter circuit group including a combination of N A/D converter circuits operable, with the same resolution as a resolution provided by the entire apparatus, at a sampling rate that is 1/N of a Baud rate of an input analog signal (where N is an integer not less than 2), the primary signal A/D converter circuit group performing time-interleaving operations of the N A/D converter circuits with sampling signals shifted by 1/N so as to convert the input analog signal into N digital signals; a correction signal generation part operable to receive the input analog signal and a 1/m-sampling signal having a speed that is 1/m of a rate of the sampling signal inputted to the primary signal A/D converter circuit group (where m is an integer not less than 2), to extract a dispersion of a transmission line that is immanent in the input analog signal from the input analog signal and the 1/m-sampling signal, and to output the extracted dispersion as a dispersion compensation control signal used for digital signal compensation; and a signal processing part operable to receive the N digital signals and the dispersion compensation control signal, to convert the N digital signals into one digital signal based upon the dispersion compensation control signal, and to compensate a dispersion included in the converted digital signal.

Advantageous Effects of the Invention

According to the present invention, provides a time-interleaved A/D converter apparatus that can reduce a circuit scale and an electric consumption without deterioration of signal quality as compared to existing methods when a plurality of A/D converter circuits performing a time-interleaving operation are applied to high-speed communication such as ultrahigh-speed optical communication.

MODE(S) FOR CARRYING OUT THE INVENTION

Embodiments of the present invention will be described with reference to FIGS. 1 to 5.

Figure 1:
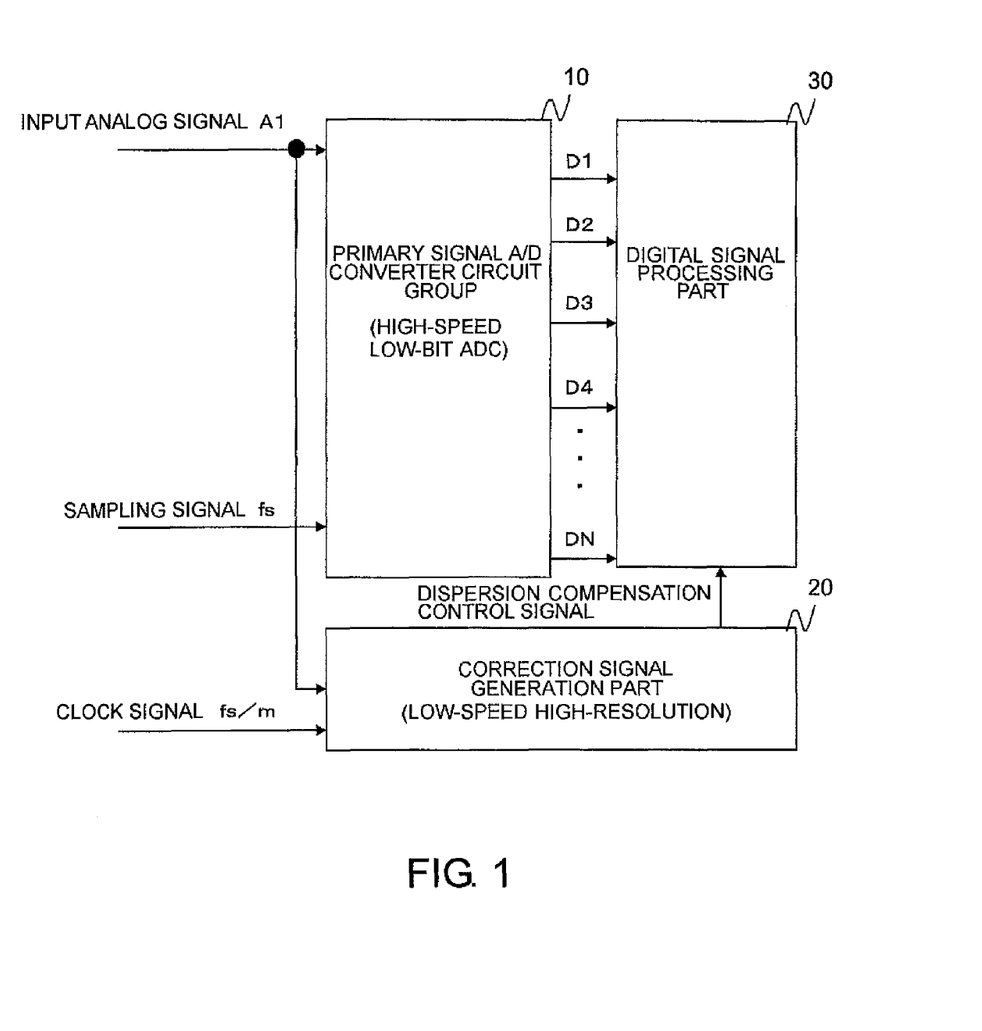
FIG. 1 is a block diagram showing a time-interleaved A/D converter apparatus according to an embodiment of the present invention.

FIG. 1 is a block diagram showing a time-interleaved A/D converter apparatus according to an embodiment of the present invention.

A primary signal A/D converter circuit group 10 includes N time-interleaved A/D converter circuits. Each of the A/D converter circuits is operable with a clock having a speed that is 1/N of a Baud rate of a sampling rate (sampling signal).

A correction signal generation part 20 is configured to receive a clock that is slower than the clock of the primary signal A/D converter circuit group 10 and an input analog signal, to extract a dispersion of a transmission line that is immanent in the input analog signal, and to output the extracted dispersion as a dispersion compensation control signal. The clock used in the correction signal generation part 20 is synchronized with a sampling signal fs inputted to the primary signal A/D converter circuit group 10. In FIG. 1, a clock fs/m obtained by performing 1/m-frequency division on the sampling signal fs is inputted to the correction signal generation part 20. The clock used in the correction signal generation part 20 may be obtained by frequency division performed either outside or inside of the correction signal generation part 20.

A digital signal processing part 30 is configured to receive output signals of the primary signal A/D converter circuit group 10 and the correction signal generation part 20, to perform a compensation process on N digital signals for a waveform distortion resulting from a dispersion of the transmission line, which has been indicated by the dispersion compensation control signal, to convert the N digital signals into one digital signal, then to output the digital signal in serial or parallel.

Such a configuration provides a time-interleaved A/D converter apparatus that can reduce a circuit scale and an electric consumption without deterioration of signal quality as compared to existing methods when a plurality of A/D converter circuits performing a time-interleaving operation are applied to high-speed communication such as ultrahigh-speed optical communication.

Next, the present invention will be described based upon some specific examples. Hereinafter, the same components are denoted by the same reference numerals, and the detailed explanation thereof is omitted herein. Nevertheless, embodiments of the present invention are not limited to the following illustrated examples.

Figure 2:
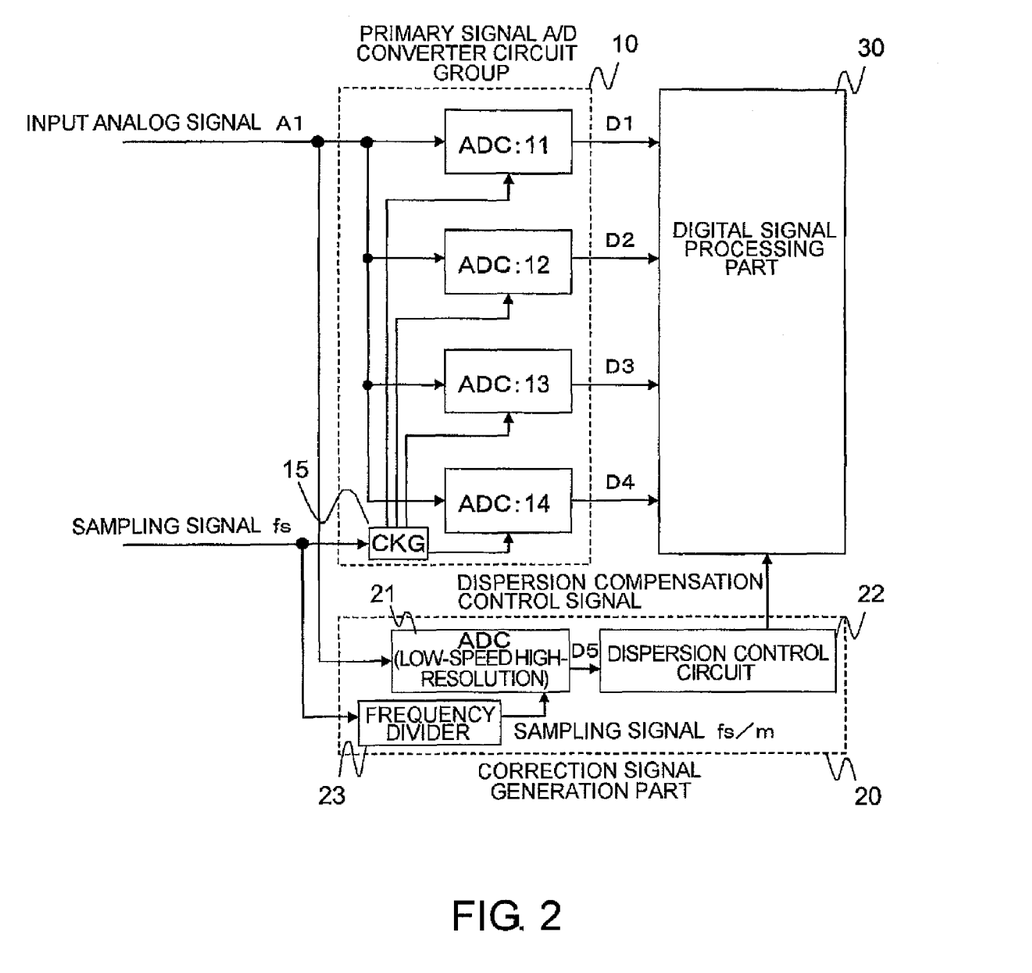
FIG. 2 is a block diagram showing a time-interleaved A/D converter apparatus according to Example 1 of the present invention.

FIG. 2 is a block diagram showing a time-interleaved A/D converter apparatus according to Example 1. In this example, the primary signal A/D converter circuit group 10 employs four A/D converter circuits 11-14 performing an interleaving operation. Furthermore, the correction signal generation part 20 employs one A/D converter circuit 21 and a dispersion control circuit 22. Since this A/D converter apparatus uses four A/D converter circuits, N=4. N is not limited to a specific value, and a suitable value may be selected for N depending upon the design specifications.

Each of the A/D converter circuits 11-14 receives an input analog signal A1 to the A/D converter apparatus and an operation clock that is shifted by ¼ (1/N) of the Baud rate of the A/D converter apparatus and outputs one of digital outputs D1-D4. In this example, a clock generator 15 is used to shift those operation clocks.

While the A/D converter circuit 21 has a resolution higher than the resolution of the A/D converter circuits 11-14, it may be operated at a speed lower than the speed of the A/D converter circuits 11-14. The A/D converter circuit 21 monitors the waveform of the input analog signal or detects an edge portion of the waveform of the input analog signal, and outputs a digital signal D5. (The A/D converter circuit 21 is hereinafter referred to as the monitoring A/D converter circuit.) In FIG. 2, a sampling signal fs/m, which is obtained by a frequency divider 23 that performs 1/m-frequency division on the sampling signal fs, is used as the operation clock. The operation clock has a speed that is 1/(N·m) of the Baud rate of the input analog signal A1. Since the A/D converter circuit 21 operates at a low speed, it is possible to obtain a digital signal D5 that can be used to extract a sufficient level of dispersion even in a case of a circuit configuration with extremely small circuit scale and low electric consumption. In the monitoring A/D converter circuit 21 having a resolution higher than the resolution of the aforementioned A/D converter circuits 11-14, the output signal D5 includes information on a waveform distortion resulting from a dispersion with a higher degree of precision.

Figure 3:
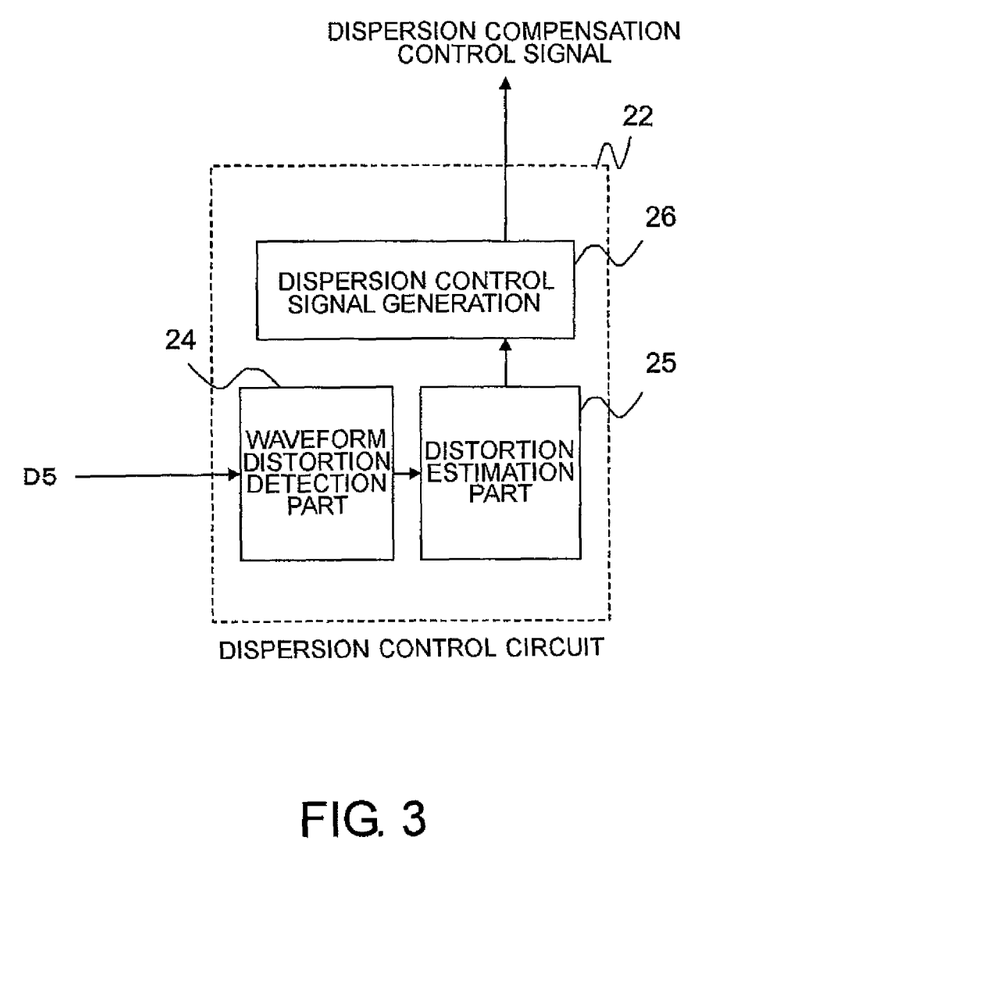
FIG. 3 is a block diagram illustrating a dispersion control circuit 22 in Example 1.

The dispersion control circuit 22 receives the output signal (D5) of the A/D converter circuit 21 and generates a dispersion compensation control signal. For example, as shown in FIG. 3, the dispersion control circuit 22 may include a waveform distortion detection part 24, a distortion estimation part 25, and a dispersion control signal generation part 26. The dispersion control circuit 22 receives the output signal D5 of the monitoring A/D converter circuit 21, detects a waveform distortion, estimates the amount of distortion from the detected value, digitizes the amount of distortion, and outputs it as a dispersion compensation control signal to the digital signal processing part 30.

The digital signal processing part 30 identifies a dispersion based upon the dispersion compensation control signal received from the dispersion control circuit 22, synthesizes the outputs D1 to D4 received from the A/D converter circuits 11-14, and then performs dispersion compensation on the synthesized signal.

Thus, the degree of a waveform distortion resulting from a dispersion included in the input analog signal A1 inputted to the A/D converter apparatus is extracted with a high degree of precision in the correction signal generation part 20. The digital signal processing part 30 is notified of the dispersion distortion. The distortion of the waveform of the input analog signal A1 is corrected in the digital signal processing part 30. With the above configuration, even if the primary signal A/D converter circuit group 10 is configured to perform a sampling operation with a Baud rate, a distortion of the waveform resulting from a dispersion can be estimated with a high degree of precision while the circuit scale and electric consumption of the correction signal generation part 20 is reduced. In other words, the A/D converter apparatus can achieve reduction of the circuit scale and electric consumption can without deterioration of the signal quality.

Figure 4:
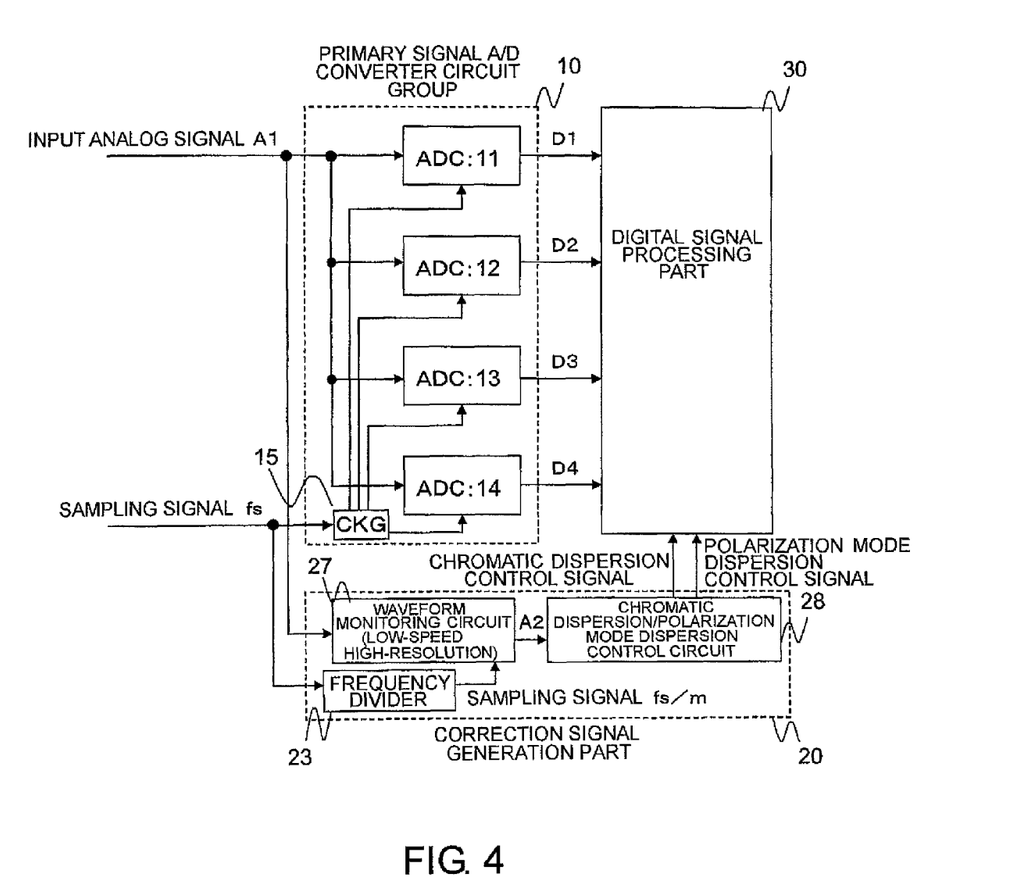
FIG. 4 is a block diagram showing a time-interleaved A/D converter apparatus according to Example 2 of the present invention.

Next, another example will be shown. FIG. 4 is a block diagram showing a time-interleaved A/D converter apparatus according to Example 2.

In this example, the primary signal A/D converter circuit group 10 employs four A/D converter circuits 11-14 performing an interleaving operation as with Example 1. Furthermore, the correction signal generation part 20 employs one waveform monitoring circuit 27 and a chromatic dispersion/polarization mode dispersion control circuit 28 unlike Example 1. Since the A/D converter apparatus uses four A/D converter circuits as with Example 1, N=4.

The waveform monitoring circuit 27 is configured to receive an input analog signal A1 and a sampling signal fs/m, and to scan the input analog signal A1 in a direction of the time axis and in a direction of the voltage amplitude so as to reproduce the shape of the waveform. Thus, the correction signal generation part 20 can obtain information on how a waveform distortion resulting from a dispersion has influence on the shape of the waveform. In this manner, since the waveform monitoring circuit 27 is operated at a low speed, an analog signal A2 to be used for extraction of a sufficient level of dispersion can be obtained even in a case of a circuit configuration with small circuit scale and low electric consumption.

Figure 5:
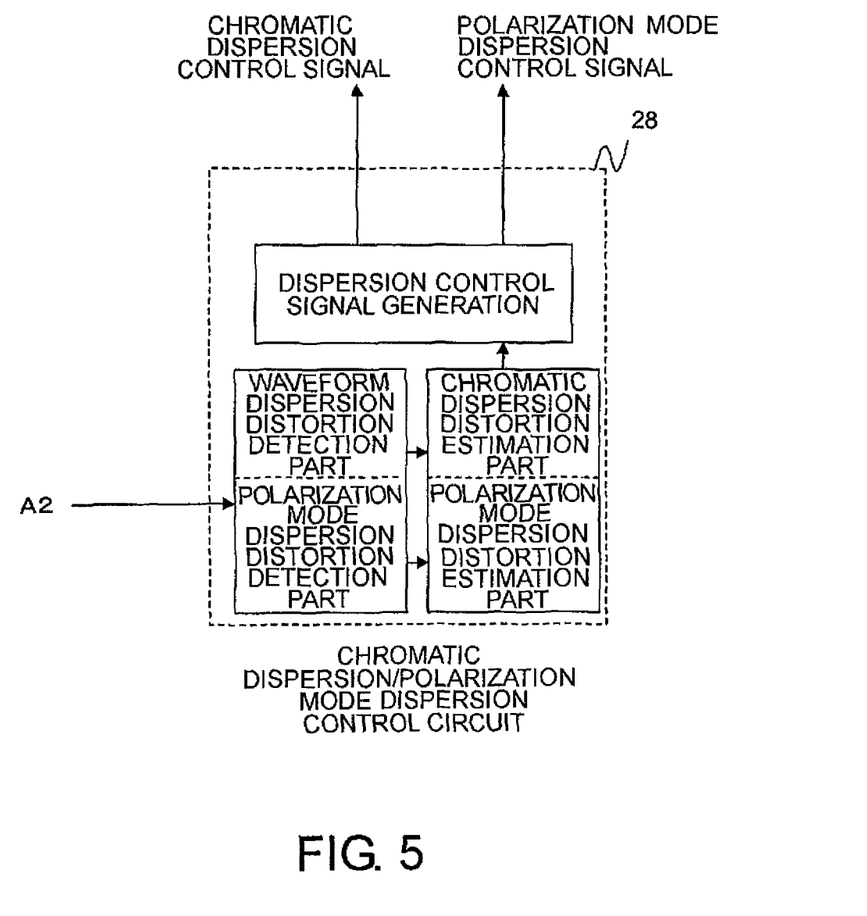
FIG. 5 is a block diagram illustrating a chromatic dispersion/polarization mode dispersion control circuit 28 in Example 2.

Furthermore, the chromatic dispersion/polarization mode dispersion control circuit 28 detects the degree of waveform distortions resulting from a chromatic dispersion and a polarization mode dispersion based upon the output analog signal A2 from the waveform monitoring circuit 27 and generates corresponding dispersion compensation control signals to be sent to the digital signal processing part 30. FIG. 5 illustrates the chromatic dispersion/polarization mode dispersion control circuit 28 that is configured to detect and estimate distortions resulting from a chromatic dispersion and a polarization mode dispersion, which are primary dispersion factors in optical fibers. With this configuration, it is possible to generate dispersion control signals that can effectively achieve compensation even if a waveform distortion resulting from a chromatic dispersion, a waveform distortion resulting from a polarization mode dispersion, or both of those distortions are mixed in the input analog signal A1.

The digital signal processing part 30 identifies a dispersion based upon both of the dispersion compensation control signals received from the chromatic dispersion/polarization mode dispersion control circuit 28, synthesizes the outputs D1 to D4 received from the A/D converter circuits 11-14, and performs a dispersion compensation.

Thus, the degree of waveform distortions resulting from dispersions included in the input analog signal A1 inputted to the A/D converter apparatus is extracted with a high degree of precision in the correction signal generation part 20, as with Example 1. The digital signal processing part 30 is notified of the dispersion distortions. The distortions of the waveform of the input analog signal A1 are corrected in the digital signal processing part 30. With the above configuration, even if the primary signal A/D converter circuit group 10 is configured to perform a sampling operation with a Baud rate, distortions of the waveform resulting from dispersions can be detected and estimated for compensation with a high degree of precision while the circuit scale and electric consumption of the correction signal generation part 20 is reduced. In other words, the A/D converter apparatus can achieve reduction of the circuit scale and electric consumption without deterioration of the signal quality.

As described above, according to the present invention, the circuit scale of the primary signal A/D converter circuit group can be reduced by half in a time-interleaved A/D converter apparatus as compared to a system that is generally configured with 2× oversampling for compensating a dispersion, which would be a problem in a configuration having time-interleaved A/D converter circuits operable with a Baud rate of an input analog signal. Reduction of the electric consumption and circuit scale of the entire circuit can be achieved while the signal quality is ensured.

Specifically, according to the present invention, provides a time-interleaved A/D converter apparatus that can reduce a circuit scale and an electric consumption without deterioration of signal quality as compared to existing methods when a plurality of A/D converter circuits performing a time-interleaving operation are applied to high-speed communication such as ultrahigh-speed optical communication.

Furthermore, the configuration of the A/D converter apparatus according to Example 1 of the present invention can remarkably reduce the scale and electric consumption of the A/D converter circuit used for compensation, as compared to the time-interleaved A/D converter apparatus disclosed in Patent Literature 2 (see FIG. 9). In Patent Literature 2, because an A/D converter circuit used for compensation is operated at the same rate (fs×N) as an equivalent sampling rate obtained during time-interleaving, the circuit scale and electric consumption of the aforementioned correction signal generation part considerably increase. Meanwhile, in the aforementioned A/D converter apparatus, the sampling clock rate is fs×1/(N·m). A portion of the circuit used for compensation is operated on the scale of about $1/(N^2 \times m)$ as compared to the A/D converter circuit disclosed in Patent Literature 2. More specifically, the scale is 1/64 even in an example where N=4 and m=4. The A/D converter circuit used for compensation in Patent Literature 2 calibrates gain and offset error components between parallel interleaved A/D converter circuits. In contrast, the A/D converter apparatus described above can correct a dispersion distortion of an optical signal itself, which is a problem in optical communication. Thus, an object to be corrected is also different from that in Patent Literature 2.

According to the present invention, a combination with a digital signal correction process in a digital signal processing part has an effect of lessening the resolution of individual A/D converter circuits of the primary signal A/D converter circuit group that processes an input analog signal. This effect cannot be obtained when individual output signals of A/D converter circuits are compensated as in Patent Literature 2.

Specific configuration of the present invention is not limited to the aforementioned embodiments. Any modifications would be included in the present invention without departing from the spirit of the present invention Some or all of the above embodiments can be described as in the following notes. Nevertheless, the present invention is not limited to those notes.

[Note 1]

A time-interleaved A/D converter apparatus characterized by comprising:

a primary signal A/D converter circuit group including a combination of N A/D converter circuits having a sampling rate that is 1/N of a Baud rate of an input analog signal (where N is an integer not less than 2) and the same resolution as a resolution provided by the entire apparatus, the primary signal A/D converter circuit group performing time-interleaving operations of the N A/D converter circuits with sampling signals shifted by 1/N so as to convert the input analog signal into N digital signals;

correction signal generation means for receiving the input analog signal and a 1/m-sampling signal having a speed that is 1/m of a rate of the sampling signal inputted to the primary signal A/D converter circuit group (where m is an integer not less than 2), extracting a dispersion of a transmission line that is immanent in the input analog signal from the input analog signal and the 1/m-sampling signal, and outputting the dispersion as a dispersion compensation control signal used for digital signal compensation; and signal processing means for receiving the N digital signals and the dispersion compensation control signal, converting the N digital signals into one digital signal based upon the dispersion compensation control signal, and compensating a dispersion included in the converted digital signal.

[Note 2]

A time-interleaved A/D converter apparatus characterized by comprising:

a primary signal A/D converter circuit group including a combination of N A/D converter circuits having a sampling rate that is 1/N of a Baud rate of an input analog signal (where N is an integer not less than 2) and the same resolution as a resolution provided by the entire apparatus, the primary signal A/D converter circuit group performing time-interleaving operations of the N A/D converter circuits with sampling signals shifted by 1/N so as to convert the input analog signal into N digital signals;

a monitoring A/D converter circuit operable to correspond to a 1/m-sampling rate obtained by performing an m-frequency division (where m is an integer not less than 2) on the sampling rate that is 1/N of the Baud rate of the input analog signal, to receive the input analog signal and the 1/m-sampling signal, to convert the input analog signal into a digital signal, and to output the digital signal;

a dispersion control circuit operable to receive the digital signal outputted from the monitoring A/D converter circuit and to generate a dispersion compensation control signal; and a signal processing circuit operable to receive the N digital signals and the dispersion compensation control signal, to convert the N digital signals into one digital signal based upon the dispersion compensation control signal, and to compensate a dispersion included in the converted digital signal.

[Note 3]

A time-interleaved A/D converter apparatus characterized by comprising:

a primary signal A/D converter circuit group including a combination of N A/D converter circuits having a sampling rate that is 1/N of a Baud rate of an input analog signal (where N is an integer not less than 2) and the same resolution as a resolution provided by the entire apparatus, the primary signal A/D converter circuit group performing time-interleaving operations of the N A/D converter circuits with sampling signals shifted by 1/N so as to convert the input analog signal into N digital signals;

a waveform monitoring circuit operable to receive the input analog signal and the 1/m-sampling signal (where m is an integer not less than 2), to detect a waveform value of the input analog signal at the 1/m-sampling rate, and to output the waveform value as an analog signal;

a dispersion control circuit operable to receive the analog signal outputted from the waveform monitoring circuit and to generate the dispersion compensation control signal; and a signal processing circuit operable to receive the N digital signals and the dispersion compensation control signal, to convert the N digital signals into one digital signal based upon the dispersion compensation control signal, and to compensate a dispersion included in the converted digital signal.

[Note 4]

The time-interleaved A/D converter apparatus as recited in Note 2, characterized in that the monitoring A/D converter circuit has a sampling rate lower than that of the primary signal A/D converter circuit group and a resolution higher than that of the primary signal A/D converter circuit group.

[Note 5]

The time-interleaved A/D converter apparatus as recited in Note 4, characterized in that the dispersion control circuit is operable to detect a waveform distortion resulting from a dispersion based upon an output signal of the monitoring A/D converter circuit and to generate the dispersion compensation control signal used for correcting the distortion of the waveform in the signal processing circuit based upon the degree of the distortion.

[Note 6]

The time-interleaved A/D converter apparatus as recited in Note 1, characterized in that the dispersion control circuit is operable to detect a waveform distortion resulting from a chromatic dispersion, a waveform distortion resulting from a polarization mode dispersion, and both of those waveform distortions from the inputted signal, and to notify the signal processing part in a data signal format corresponding to the signal processing circuit.

[Note 7]

The time-interleaved A/D converter apparatus as recited in Note 1, characterized in that the correction signal generation means receives a signal into which the sampling signal inputted to the primary signal A/D converter circuit group is branched and uses a frequency-divided signal to extract the dispersion.

[Note 8]

An optical communication apparatus including the time-interleaved A/D converter apparatus as recited in any one of the above Notes.

[Note 9]

A distortion compensation method in a time-interleaved A/D converter apparatus, characterized by:

combining N A/D converter circuits having a sampling rate that is 1/N of a Baud rate of an input analog signal (where N is an integer not less than 2) and the same resolution as a resolution provided by the entire apparatus and performing time-interleaving operations of the N A/D converter circuits with sampling signals shifted by 1/N so as to convert the input analog signal into N digital signals;

receiving the input analog signal and a 1/m-sampling signal having a speed that is M/n of a rate of the sampling signal inputted to each of the A/D converter circuits (where m is an integer not less than 2), extracting a dispersion of a transmission line that is immanent in the input analog signal from the input analog signal and the 1/m-sampling signal, and outputting the dispersion as a dispersion compensation control signal for digital signal compensation; and receiving the N digital signals and the dispersion compensation control signal in a signal processing part, converting the N digital signals into one digital signal based upon the dispersion compensation control signal, and compensating a dispersion included in the converted digital signal.

[Note 10]

A distortion compensation method in a time-interleaved A/D converter apparatus, characterized by:

combining N A/D converter circuits having a sampling rate that is 1/N of a Baud rate of an input analog signal (where N is an integer not less than 2) and the same resolution as a resolution provided by the entire apparatus and performing time-interleaving operations of the N A/D converter circuits with sampling signals shifted by 1/N so as to convert the input analog signal into N digital signals;

converting the input analog signal into a digital signal and outputting the digital signal in a monitoring A/D converter circuit operable in response to the input analog signal and the 1/m-sampling signal so as to correspond to a 1/m-sampling rate obtained by performing an en-frequency division (where m is an integer not less than 2) on the sampling rate that is 1/N of the Baud rate of the input analog signal;

receiving the digital signal outputted from the monitoring A/D converter circuit and generating a dispersion compensation control signal in a dispersion control circuit; and receiving the N digital signals and the dispersion compensation control signal, converting the N digital signals into one digital signal based upon the dispersion compensation control signal, and compensating a dispersion included in the converted digital signal within a signal processing circuit.

[Note 11]

A distortion compensation method in a time-interleaved A/D converter apparatus, characterized by:

combining N A/D converter circuits having a sampling rate that is 1/N of a Baud rate of an input analog signal (where N is an integer not less than 2) and the same resolution as a resolution provided by the entire apparatus and performing time-interleaving operations of the N A/D converter circuits with sampling signals shifted by 1/N so as to convert the input analog signal into N digital signals;

receiving the input analog signal and the 1/m-sampling signal (where m is an integer not less than 2), detecting a waveform value of the input analog signal at a 1/m-sampling rate, and outputting the waveform value as an analog signal in a waveform monitoring circuit;

receiving the analog signal outputted from the waveform monitoring circuit and generating a dispersion compensation control signal in a dispersion control circuit; and receiving the N digital signals and the dispersion compensation control signal, converting the N digital signals into one digital signal based upon the dispersion compensation control signal, and compensating a dispersion included in the converted digital signal within a signal processing circuit.

[Note 12]

The distortion compensation method in a time-interleaved A/D converter apparatus as recited in Note 10, characterized in that the monitoring A/D converter circuit has a sampling rate lower than that of the primary signal A/D converter circuit group and a resolution higher than that of the primary signal A/D converter circuit group.

[Note 13]

The distortion compensation method in a time-interleaved A/D converter apparatus as recited in Note 12, characterized in that the dispersion control circuit is operable to detect a waveform distortion resulting from a dispersion based upon an output signal of the monitoring A/D converter circuit and to generate the dispersion compensation control signal used for correcting the distortion of the waveform in the signal processing circuit based upon the degree of the distortion.

[Note 14]

The distortion compensation method in a time-interleaved A/D converter apparatus as recited in Note 9, characterized in that the dispersion control circuit is operable to detect a waveform distortion resulting from a chromatic dispersion, a waveform distortion resulting from a polarization mode dispersion, and both of those waveform distortions from the inputted signal, and to notify the signal processing circuit in a data signal format corresponding to the signal processing circuit.

[Note 15]

The distortion compensation method in a time-interleaved A/D converter apparatus as recited in Note 9, characterized in that the correction signal generation means receives a signal into which the sampling signal inputted to the primary signal A/D converter circuit group is branched and uses a frequency-divided signal to extract the dispersion.

This application claims the benefit of priority from Japanese patent application No. 2010-071481, filed on Mar. 26, 2010, the disclosure of which is incorporated herein in its entirety by reference.

[Description of Reference Numerals]

10 primary signal A/D converter circuit group
11-14 A/D converter circuit
15 clock generator
20 correction signal generation part
21 monitoring A/D converter circuit
22 dispersion control circuit
23 frequency divider
24 waveform distortion detection part
25 distortion estimation part
26 dispersion control signal generation part
27 waveform monitoring circuit
28 chromatic dispersion/polarization mode dispersion control circuit
30 digital signal processing part (signal processing circuit)
A1 input analog signal (primary signal)
A2 output analog signal of waveform monitoring circuit
D1-DN output digital signal of A/D converter circuit
D5 output digital signal of monitoring A/D converter circuit

The invention claimed is:

1. A time-interleaved A/D converter apparatus, comprising:

a primary signal A/D converter circuit group including a combination of N A/D converter circuits operable, with the same resolution as a resolution provided by the entire apparatus, at a sampling rate that is 1/N of a Baud rate of an input analog signal (where N is an integer not less than 2), the primary signal A/D converter circuit group performing time-interleaving operations of the N A/D converter circuits with sampling signals shifted by 1/N so as to convert the input analog signal into N digital signals;

a correction signal generation part operable to receive the input analog signal and a 1/m-sampling signal having a speed that is 1/m of a rate of the sampling signal inputted to the primary signal A/D converter circuit group (where m is an integer not less than 2), to extract a dispersion of a transmission line that is immanent in the input analog signal from the input analog signal and the 1/m-sampling signal, and to output the extracted dispersion as a dispersion compensation control signal used for digital signal compensation; and a signal processing part operable to receive the N digital signals and the dispersion compensation control signal, to convert the N digital signals into one digital signal based upon the dispersion compensation control signal, and to compensate a dispersion included in the converted digital signal.

2. The time-interleaved A/D converter apparatus as recited in claim 1, wherein the correction signal generation part includes:

a monitoring A/D converter circuit operable to correspond to a 1/m-sampling rate obtained by performing an m-frequency division (where m is an integer not less than 2) on the sampling rate that is 1/N of the Baud rate of the input analog signal, to receive the input analog signal and the 1/m-sampling signal, to convert the input analog signal into a digital signal, and to output the digital signal, and a dispersion control circuit operable to receive the digital signal outputted from the monitoring A/D converter circuit and to generate a dispersion compensation control signal.

3. The time-interleaved A/D converter apparatus as recited in claim 1, wherein the correction signal generation part includes:
- a waveform monitoring circuit operable to receive the input analog signal and the 1/m-sampling signal (where m is an integer not less than 2), to detect a waveform value of the input analog signal at the 1/m-sampling rate, and to output the waveform value as an analog signal, and
- a dispersion control circuit operable to receive the analog signal outputted from the waveform monitoring circuit and to generate the dispersion compensation control signal.

4. The time-interleaved A/D converter apparatus as recited in claim 2, wherein the monitoring A/D converter circuit has a sampling rate lower than that of the primary signal A/D converter circuit group and a resolution higher than that of the primary signal A/D converter circuit group.

5. The time-interleaved A/D converter apparatus as recited in claim 4, wherein the dispersion control circuit is operable to detect a waveform distortion resulting from a dispersion based upon an output signal of the monitoring A/D converter circuit and to generate the dispersion compensation control signal used for correcting the distortion of the waveform in the signal processing part based upon the degree of the distortion.

6. The time-interleaved A/D converter apparatus as recited in claim 2, wherein the dispersion control circuit is operable to detect a waveform distortion resulting from a chromatic dispersion, a waveform distortion resulting from a polarization mode dispersion, or both of those waveform distortions from the inputted signal, and to notify the signal processing part in a data signal format corresponding to the signal processing part.

7. The time-interleaved A/D converter apparatus as recited in claim 1, wherein the correction signal generation part includes a frequency division part operable to receive a signal into which the sampling signal inputted to the primary signal A/D converter circuit group is branched and to use a frequency-divided signal as the 1/m sampling signal to extract the dispersion.

8. An optical communication apparatus including the time-interleaved A/D converter apparatus as recited in claim 1.

9. A distortion compensation method in a time-interleaved A/D converter apparatus, comprising:
- combining N A/D converter circuits operable, with the same resolution as a resolution provided by the entire apparatus, at a sampling rate that is 1/N of a Baud rate of an input analog signal (where N is an integer not less than 2) and performing time-interleaving operations of the N A/D converter circuits with sampling signals shifted by 1/N so as to convert the input analog signal into N digital signals;
- receiving the input analog signal and a 1/m-sampling signal having a speed that is 1/m of a rate of the sampling signal inputted to each of the N A/D converter circuits (where m is an integer not less than 2), extracting a dispersion of a transmission line that is immanent in the input analog signal from the input analog signal and the 1/m-sampling signal, and outputting the extracted dispersion as a dispersion compensation control signal used for digital signal compensation; and
- receiving the N digital signals and the dispersion compensation control signal in a signal processing part, converting the N digital signals into one digital signal based upon the dispersion compensation control signal, and compensating a dispersion included in the converted digital signal.

10. The time-interleaved A/D converter apparatus as recited in claim 3, wherein the dispersion control circuit is operable to detect a waveform distortion resulting from a chromatic dispersion, a waveform distortion resulting from a polarization mode dispersion, or both of those waveform distortions from the inputted signal, and to notify the signal processing part in a data signal format corresponding to the signal processing part.

11. An optical communication apparatus including the time-interleaved A/D converter apparatus as recited in claim 2.

12. An optical communication apparatus including the time-interleaved A/D converter apparatus as recited in claim 3.

13. An optical communication apparatus including the time-interleaved A/D converter apparatus as recited in claim 4.

14. An optical communication apparatus including the time-interleaved A/D converter apparatus as recited in claim 5.

15. An optical communication apparatus including the time-interleaved A/D converter apparatus as recited in claim 6.

16. An optical communication apparatus including the time-interleaved A/D converter apparatus as recited in claim 7.

17. An optical communication apparatus including the time-interleaved A/D converter apparatus as recited in claim 10.

* * * * *